US009385301B2

(12) United States Patent
Kando et al.

(10) Patent No.: US 9,385,301 B2
(45) Date of Patent: Jul. 5, 2016

(54) METHOD FOR MANUFACTURING COMPOSITE PIEZOELECTRIC SUBSTRATE

(71) Applicant: Murata Manufacturing Co., Ltd., Nagaokakyo-shi, Kyoto-fu (JP)

(72) Inventors: Hajime Kando, Ritto (JP); Yoshiharu Yoshii, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 187 days.

(21) Appl. No.: 14/068,007

(22) Filed: Oct. 31, 2013

(65) Prior Publication Data

US 2014/0173862 A1   Jun. 26, 2014

Related U.S. Application Data

(63) Continuation of application No. 12/645,759, filed on Dec. 23, 2009, now Pat. No. 8,973,229, which is a continuation of application No. PCT/JP2008/069212, filed on Oct. 23, 2008.

(30) Foreign Application Priority Data

Dec. 25, 2007   (JP) .................... 2007-333044

(51) Int. Cl.
*H01L 41/27* (2013.01)
*H01L 41/25* (2013.01)
(Continued)

(52) U.S. Cl.
CPC .............. *H01L 41/27* (2013.01); *H01L 41/187* (2013.01); *H01L 41/257* (2013.01);
(Continued)

(58) Field of Classification Search
CPC ....... H01L 41/187; H01L 41/25; H01L 41/27; H01L 41/257; H01L 41/312; H01L 41/335; H01L 41/337; H03H 3/02; H03H 3/08; H03H 2003/021; H03H 2003/023; H03H 2003/027; Y10T 29/42; Y10T 29/49005; Y10T 29/49155; G02F 1/035
See application file for complete search history.

(56) References Cited

U.S. PATENT DOCUMENTS 3,502,598 A * 3/1970 Nagase ................ H01L 41/187
252/62.9 R
4,056,304 A * 11/1977 Phillips .................. G02F 1/035
385/10

(Continued)

FOREIGN PATENT DOCUMENTS

JP        2006228866 A  *  8/2006

OTHER PUBLICATIONS

Kando et al., "Method for Manufacturing Composite Piezoelectric Substrate", U.S. Appl. No. 12/645,759, filed Dec. 23, 2009.

*Primary Examiner* — A. Dexter Tugbang
(74) *Attorney, Agent, or Firm* — Keating & Bennett, LLP

(57) ABSTRACT

A method for manufacturing a composite piezoelectric substrate capable of forming an ultra-thin piezoelectric film includes preparing a piezoelectric substrate and a supporting substrate, implanting ions from a surface of the piezoelectric substrate to form a defective layer in a region of the piezoelectric substrate, removing impurities that are adhered to at least one of the surface of the piezoelectric substrate in which the defective layer is formed and a surface of the supporting substrate to directly expose the constituent atoms of the surfaces and to activate the surfaces, bonding the supporting substrate to the surface of the piezoelectric substrate to form a bonded substrate body, and separating the bonded substrate body at the defective layer formed in the piezoelectric substrate so that a separation layer between the surface of the piezoelectric substrate and the defective layer is separated from the piezoelectric substrate.

6 Claims, 5 Drawing Sheets

(51) Int. Cl.
*H01L 41/187* (2006.01)
*H01L 41/335* (2013.01)
*H01L 41/337* (2013.01)
*H01L 41/257* (2013.01)
*H01L 41/312* (2013.01)
*H03H 3/08* (2006.01)
*H03H 3/02* (2006.01)
*G02F 1/035* (2006.01)

(52) U.S. Cl.
CPC ........... *H01L 41/312* (2013.01); *H01L 41/335* (2013.01); *H01L 41/337* (2013.01); *G02F 1/035* (2013.01); *H01L 41/25* (2013.01); *H03H 3/02* (2013.01); *H03H 3/08* (2013.01); *H03H 2003/021* (2013.01); *H03H 2003/023* (2013.01); *H03H 2003/027* (2013.01); *Y10T 29/42* (2015.01); *Y10T 29/49005* (2015.01); *Y10T 29/49155* (2015.01)

(56) References Cited

U.S. PATENT DOCUMENTS 4,551,647 A * 11/1985 Day ................. Y10T 29/42
                                                29/25.35
6,445,265 B1 * 9/2002 Wright ............... H03H 3/08
                                                29/25.35

* cited by examiner

METHOD FOR MANUFACTURING COMPOSITE PIEZOELECTRIC SUBSTRATE

BACKGROUND OF THE INVENTION

1. Field of the Invention

The present invention relates to a method for manufacturing a composite piezoelectric substrate, and particularly, to a method for manufacturing a composite piezoelectric substrate including a piezoelectric film.

2. Description of the Related Art

Recently, filters using ultra-thin piezoelectric materials, such as ultra-thin piezoelectric films, have been actively developed. Although AlN thin films and ZnO thin films formed by a deposition method, such as a sputtering method, a CVD method, or other suitable method are generally used as the ultra-thin piezoelectric films in filters and other similar devices, any one of the films can be a C-axis oriented film in which the C-axis is aligned in the vertical direction of a substrate.

On the other hand, it has been proposed to manufacture a composite piezoelectric substrate including a piezoelectric film by bonding a piezoelectric single crystal substrate to a supporting substrate and then thinning the piezoelectric single crystal substrate by polishing.

For example, a surface acoustic wave device 100 shown in a sectional view of FIG. 6 includes a piezoelectric substrate 101 made of a single crystal and having an excitation electrode 105 provided thereon, the piezoelectric substrate 101 being thinned by polishing in a state in which the piezoelectric substrate 101 is previously bonded to a protective substrate 103 through a glass layer 108 (see, for example, Japanese Unexamined Patent Application Publication No. 2002-16468 and Japanese Unexamined Patent Application Publication No. 2002-16468).

In addition, a method has been proposed, in which hydrogen ions are implanted into a piezoelectric substrate, the piezoelectric substrate and a supporting substrate are disposed in a wet atmosphere to form hydrophilic groups on a surface of each of the substrates and then the substrates are bonded together. Subsequently, the piezoelectric substrate is broken at the depth of the ion implantation by high-speed heating to form a piezoelectric thin film (see, for example, Japanese Unexamined Patent Application Publication No. 2002-534886).

However, a piezoelectric film formed by the deposition method has severe limitations on the materials that can be used due to the deposition temperature and deposition conditions for forming an oriented film, and AlN is primarily used. Also, the orientation direction of a crystal axis cannot be accurately controlled, and a C-axis oriented film is primarily used, thereby causing difficulty in designing a vibration mode by inclining a piezoelectric axis.

On the other hand, a piezoelectric film that is formed by polishing a piezoelectric single crystal substrate results in most of the piezoelectric single crystal becoming polishing waste, thereby causing a low efficiency of material utilization. Further, the thickness of the piezoelectric film depends on variations in the polishing speed and waviness of the substrate before polishing, and thus, it is difficult to accurately control the thickness so as to produce uniform thickness, thereby causing low productivity.

Japanese Unexamined Patent Application Publication No. 2002-534886 uses bonding with hydrophilic groups. This bonding method forms hydrophilic groups on surfaces of the piezoelectric substrate and the supporting substrate so that the substrates are bonded through the hydrophilic groups. Since bonding through the hydrophilic groups is very weak, to achieve strong bonding, it is necessary to perform a step of strengthening the bond between the surfaces of the piezoelectric substrate and the supporting substrate by heating the substrates at a temperature (e.g., about 400° C.) at which the hydrophilic groups can be decomposed to eliminate hydrogen (H) from the hydrophilic groups.

However, there are problems in that gas stays in the bonding interface due to the elimination of hydrogen gas after bonding, thereby forming microcavities, and in that hydrogen gas cannot be sufficiently removed and remains in the piezoelectric crystal, thereby breaking the crystal structure and degrading the piezoelectricity. The non-uniformity at the bonding interface due to the microcavities or the crystal breakage causes generation of heat due to elastic scattering or sound absorption when used in surface acoustic wave filters and bulk acoustic wave filters. This causes a deterioration of insertion loss of a filter and a deterioration of electric power resistance due to heat generation.

In particular, when $LiTaO_3$ or $LiNbO_3$ is used, remaining hydrogen causes substitution of Li at a Li site with hydrogen and easily degrades the piezoelectricity.

For example, a lithium tantalate or lithium niobate substrate is used as a piezoelectric substrate, and a lithium tantalate or lithium niobate substrate is also used as a supporting substrate. The surfaces of the piezoelectric substrate and the supporting substrate are smoothed by CMP (chemical mechanical polishing), and then the piezoelectric substrate and the supporting substrate are exposed to a wet atmosphere to form hydrophilic groups. The surfaces of the piezoelectric substrate and the supporting substrate arranged in contact and bonded together to cause weak bonding with hydrophilic groups. Then, the substrates are heated at 500° C. for hour to cause strong bonding by the decomposition of hydrophilic groups. A composite piezoelectric substrate formed by this bonding method easily produces separation at the bonding interface when an external force is applied before heating at 500° C. On the other hand, bonding is strengthened after heating at 500° C., but visible cavities are formed throughout the bonding interface. In addition, the crystalline arrangement of the bonding interface when viewed using a TEM (transmission electron microscope) shows cavities of several tens of nm and disorder of the crystal arrangement.

Further, when H ions are implanted and a polarization state of $LiTaO_3$ after heating 400° C. is examined with a nonlinear dielectric microscope, it is discovered that polarization polarities that are initially arrayed are locally inverted in domain units, which degrades the piezoelectricity. The piezoelectricity is significantly degraded by heating at a temperature of 500° C.

SUMMARY OF THE INVENTION

To overcome the problems described above, preferred embodiments of the present invention provide a method for manufacturing a composite piezoelectric substrate in which an ultra-thin piezoelectric film having a uniform thickness is formed by efficiently using a piezoelectric material.

A method for manufacturing a composite piezoelectric substrate according to a preferred embodiment of the present invention includes a first step of preparing a piezoelectric substrate and a supporting substrate, a second step of implanting ions from a surface of the piezoelectric substrate to form a defective layer in a region having a predetermined depth from the surface of the piezoelectric substrate, a cleaning activation step of removing impurities adhering to at least one of the surface of the piezoelectric substrate in which the defective layer is formed and a surface of the supporting substrate to directly expose the constituent atoms of the surface and activate the surfaces, a third step of bonding the supporting substrate to the surface of the piezoelectric substrate after the cleaning activation step to form a bonded substrate body, a fourth step of separating the bonded substrate body at the defective layer formed in the piezoelectric substrate so that a separation layer between the surface of the piezoelectric substrate and the defective layer is separated from the piezoelectric substrate and bonded to the supporting substrate to form a composite piezoelectric substrate, and a fifth step of smoothing the surface of the separation layer of the composite piezoelectric substrate.

When a composite piezoelectric substrate including a separation layer bonded thereto is manufactured by the method described above, an ultra-thin piezoelectric material, such as an ultra-thin piezoelectric film, for example, can be formed on a surface of the composite piezoelectric substrate. For example, a composite piezoelectric substrate including a piezoelectric ultra-thin single crystal film can be manufactured using a single crystal piezoelectric substrate.

The method according to this preferred embodiment is capable of reusing the piezoelectric substrate after the separation layer is separated. Thus, many composite piezoelectric substrates can be manufactured using a piezoelectric substrate, and the amount of waste of piezoelectric material can be significantly decreased to decrease the amount of piezoelectric material used, as compared to the case in which a piezoelectric film is formed by polishing a piezoelectric substrate.

In addition, the thickness of the separation layer is determined by the energy of the ion implantation, and the thickness of a piezoelectric material does not depend on the waviness of the substrate, thereby enabling the formation of a uniform ultra-thin film. Therefore, it is possible to produce a composite piezoelectric substrate including an ultra-thin piezoelectric film with a uniform thickness formed on a surface of the piezoelectric substrate.

Preferably, the method further includes a polarization step of polarizing the separation layer of the composite piezoelectric substrate after the second step and before the cleaning activation step or after the cleaning activation step, and more preferably, after the fifth step.

In this case, variations in the ion implantation, for example, the dose amount and the implantation depth, and breakage of the substrate caused by pyroelectric charge excited on the surface of the piezoelectric substrate are avoided in the polarization step.

In ion implantation in the third step, preferably, ions are implanted in the same direction as the shift direction of the constituent atoms of the piezoelectric substrate that are spontaneously polarized.

In this case, deterioration in piezoelectricity of the piezoelectric substrate due to ion implantation is prevented.

In addition, the elimination of hydrogen remaining at the bonding interface is not required because the bonding in the cleaning activation step does not include bonding with OH groups by hydrophilization. Therefore, high-temperature heating for a long period of time to decompose hydrophilic groups is not required. In addition, the generation of gas and the formation of microcavities do not occur at the bonding interface, and hydrogen gas does not remain in the piezoelectric crystal. Therefore, breakage of the crystal structure and deterioration of piezoelectricity are prevented. In particular, when $LiTaO_3$ or $LiNbO_3$ is used, the exchange between Li at a Li ion site and hydrogen due to residual hydrogen is not produced, thereby the piezoelectricity is maintained.

By using an ultra-thin piezoelectric material as a separation layer of a piezoelectric substrate formed in a composite piezoelectric substrate manufactured by the method according to various preferred embodiments of the present invention, elastic wave devices, such as a surface acoustic wave device, a boundary acoustic wave device, a bulk acoustic wave device, and a plate wave device, for example, can preferably be formed. When a composite piezoelectric substrate manufactured by the method according to a preferred embodiment of the present invention is used to manufacture an electronic component including an elastic wave device, the amount of the piezoelectric substrate that is used in the manufacturing method is significantly reduced.

A method for manufacturing a composite piezoelectric substrate according to another preferred embodiment of the present invention includes a first step of preparing a piezoelectric substrate and a supporting substrate, a second step of implanting ions from a surface of the piezoelectric substrate to form a defective layer in a region at a predetermined depth from the surface of the piezoelectric substrate, a third step of bonding the supporting substrate to the surface of the piezoelectric substrate to form a bonded substrate body, a fourth step of separating the bonded substrate body at the defective layer formed in the piezoelectric substrate so that a separation layer between the surface of the piezoelectric substrate and the defective layer is separated from the piezoelectric substrate and bonded to the supporting substrate to form a composite piezoelectric substrate, a fifth step of smoothing the surface of the separation layer of the composite piezoelectric substrate, and a sixth step of polarizing the separation layer of the composite piezoelectric substrate after the second step and before the third step or after the third step.

The method according to this preferred embodiment can be repaired even when polarization is inverted by ion implantation.

The method for manufacturing a composite piezoelectric substrate according to various preferred embodiments of the present invention is capable of forming an ultra-thin piezoelectric film having a uniform thickness by efficiently using a piezoelectric material.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention are described with reference to FIGS. 1A-1 through FIG. 5B.

A method for manufacturing a surface acoustic wave (SAW) device a preferred embodiment of the present invention is described with reference to FIGS. 1A-1 through FIG. 5B.

First, steps for manufacturing a composite piezoelectric substrate 30 used in a SAW device are described with reference to FIGS. 1A-1 through 1F-2, which are sectional views showing steps for manufacturing the composite piezoelectric substrate 30.

Figures 1, 1A:
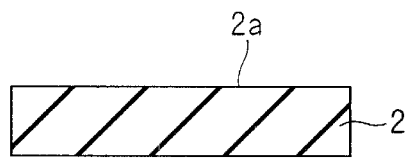
FIGS. 1A-1 through 1F-2 are sectional views showing steps for manufacturing a composite piezoelectric substrate according to a preferred embodiment of the present invention.
Figures 1, 1A, 2:
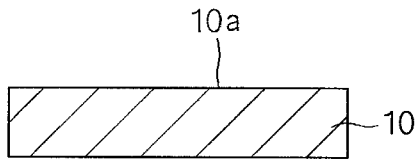

As shown in FIGS. 1A-1 and 1A-2, a piezoelectric substrate 2 and a supporting substrate 10 are prepared. For example, a 42° Y-cut $LiTaO_3$ substrate is preferably prepared as the piezoelectric substrate 2, and a Si substrate is preferably prepared as the supporting substrate 10. Surfaces 2a and 10a of the substrates 2 and 10, respectively, are previously polished to mirror surfaces.

Figure 1B:
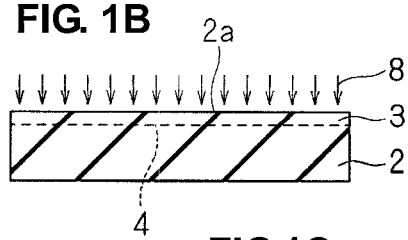

Next, as shown by arrows 8 in FIG. 1B, ions are implanted into a region having a predetermined depth from the surface 2a of the piezoelectric substrate 2 to form a defective layer 4, which is schematically shown by a broken line in FIG. 1B, in a region having a predetermined depth from the surface 2a of the piezoelectric substrate 2. For example, $H^+$ ions are preferably implanted into the $LiTaO_3$ piezoelectric substrate 2. Preferably, the implantation energy is about 150 Kev and the dose is about $9\times10^{16}$ $cm^{-1}$, for example. In this case, the defective layer 4 in which $H^+$ ions are distributed from the surface 2a of the piezoelectric substrate 2 to a depth of about 11 µm is formed.

The piezoelectric substrate 2 and the supporting substrate 10 are disposed in a reduced-pressure chamber, and the surfaces 2a ad 10a are irradiated with Ar ion beams to remove impurities such as hydrophilic groups, hydrogen, and oxide films, for example, that are adhered to the surfaces 2a and 10a. The constituent atoms of the substrates 2 and 10 are directly exposed from the surfaces 2a and 10a from which impurities are removed, and thus, the surfaces 2a and 10a are activated. When the cleaned and activated surfaces 2a and 10a are arranged into contact with each other in vacuum, the elements are directly bonded to achieve strong bonding. Since impurities are absent from the bonding interface, removal of impurities after bonding is not required, thereby preventing breakage of a crystal near the bonding interface.

Figure 1C:
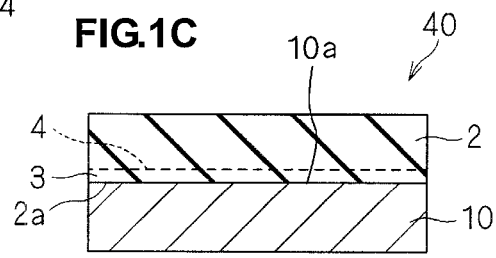

Next, as shown in FIG. 1C, the surface 2a of the piezoelectric substrate 2 and the surface 10a of the supporting substrate 10a are bonded together to form a bonded substrate body 40.

In the case of the $LiTaO_3$ piezoelectric substrate 2 and the Si supporting substrate 10, since the substrates 2 and 10 have different linear thermal expansion coefficients, room-temperature direct bonding is preferably performed, in which the substrate surfaces 2a and 10a are activated with plasma at room temperature and bonded in a vacuum.

After the $LiTaO_3$ piezoelectric substrate 2 and the Si supporting substrate 10 are bonded, the substrates 2 and 10 are heated at about 500° C., for example. As a result, microcavities are produced along the surface 2a in the defective layer 4 at a depth of about 1 µm, for example, from the surface 2a of the $LiTaO_3$ piezoelectric substrate 2 implanted with $H^+$ ions, and the cavities are grown by heating.

In order to strengthen the bonding of elements, a small amount, i.e., several nm, of metal elements, such as Fe, for example, may preferably be deposited at the bonding interface. Metal elements are easily contaminated by oxidation in air. Therefore, metal ions are preferably deposited immediately before bonding in a bonding chamber under pressure reduced to a vacuum.

Figure 1D:
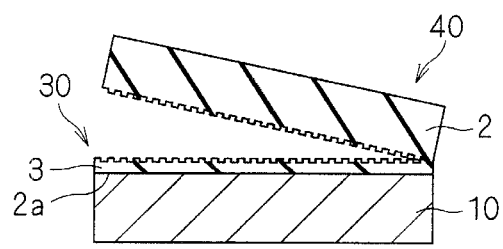

Next, as shown in FIG. 1D, the piezoelectric substrate 2 and the supporting substrate 10 in the bonded substrate body are separated at the defective layer 4 formed in the piezoelectric substrate 2 so that a separation layer 3 between the surface 2a of the piezoelectric substrate 2 and the defective layer 4 is separated from the piezoelectric substrate and bonded to the supporting substrate 10 to form the composite piezoelectric substrate 30.

For example, since the substrates 2 and 10 are separated along microcavities formed in the defective layer 4 at a depth of about 1 µm from the surface 2a of the $LiTaO_3$ piezoelectric substrate 2, the composite piezoelectric substrate 30 in which the separation layer 3 including a $LiTaO_3$ thin film with a thickness of about 1 µm is bonded to the surface 10a of the supporting substrate 10 is separated from the $LiTaO_3$ piezoelectric substrate 2 in which the separation layer 3 including a $LiTaO_3$ thin film is separated from the surface 2a side.

Figures 1, 1E:
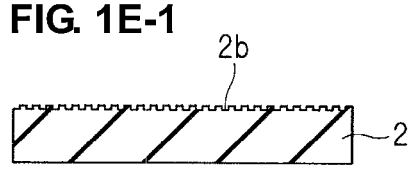
Figures 1, 1E, 2:
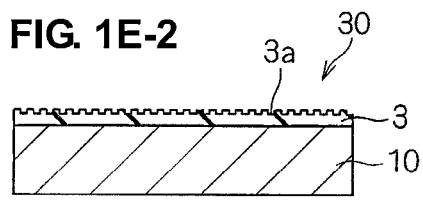
Figures 1, 1F:
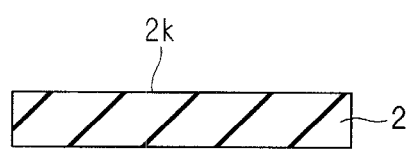
Figures 1, 1F, 2:
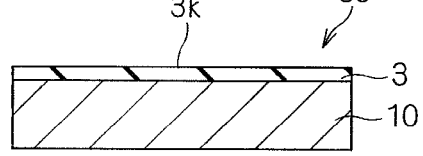

Next, as schematically shown in FIGS. 1E-1 and 1E-2, the surfaces 2a and 3a of the piezoelectric substrate 2 and the composite piezoelectric substrate 30, which are fracture surfaces having irregularities formed thereon, are polished to smooth surfaces 2k and 3k of the piezoelectric substrate 2 and the composite piezoelectric substrate 30 as shown in FIGS. 1F-1 and 1F-2.

For example, the surface 3a of the composite piezoelectric substrate 30 on which a fracture surface of the separation layer 3 including a $LiTaO_3$ thin film is provided and the surface 2a of the $LiTaO_3$ piezoelectric substrate 2 from which the separation layer 3 including a $LiTaO_3$ thin film is separated are surfaces with RMS (root mean square) roughness of about 1 mm. Therefore, the surfaces 2a and 3a are smoothed by polishing to remove a thickness of about 100 nm.

In the composite piezoelectric substrate 30 having the smoothed surface 3k, polarization is performed to correct polarization inversion of the piezoelectric material of the separation layer 3. For example, the separation layer 3 including a $LiTaO_3$ thin film and having the smoothed surface 3a is preferably polarized by applying a pulse voltage of about 22 kV at 400° C. and about 5 ms.

A portion of the atoms defining a piezoelectric crystal are positively or negatively charged and ionized. For example, when an electric field is applied to the ionized atoms, positively charged ions slightly shift in the crystal to the cathode side, and negatively charged ions slightly shift to the anode side to induce dipoles. This phenomenon is referred to as electric polarization. There are crystals which can maintain a polarization state even if application of an electric field is stopped, and this state is referred to as the above-described spontaneous polarization. When a large amount of ions are implanted with high energy into a piezoelectric crystal that is spontaneously polarized, the shift states of ions are changed to cause polarization inversion. This partial polarization inversion causes deterioration of piezoelectricity and is thus undesirable.

Therefore, polarization inversion can be repaired by polarization after ion implantation. For example, in the case of $LiNbO_3$, an electric field of about 22 kV/mm is applied in a heating atmosphere at about 700° C. Polarization is preferably performed after the separation step, and the temperature is preferably about 200° C. to about 1200° C. based on the melting points of the supporting substrate and the electrode and the difference between the thermal expansion coefficients. Since the coercive electric field decreases as the temperature increases, the applied electric field can be reduced to a lower field. In addition, the electric field is preferably intermittently applied within the range of about 1 s to about 1 minute because damage to a crystal caused by a direct-current electric field can be prevented. Further, heating at about 200° C. or more is preferable because the strain on the crystal caused by ion implantation is reduced. The heating temperature for removing crystal strain is at least about 100° C. less than the Curie temperature in order to avoid depolarization.

Although deterioration of piezoelectricity, such as polarization inversion, for example, can be repaired by the polarization in Step 6, deterioration of piezoelectricity, such as polarization inversion, is preferably suppressed as much as possible before Step 6 because a load is applied to the crystal. In addition, with piezoelectric materials that are difficult to polarize due to the crystal materials and the crystal orientations, a step of preventing the deterioration of piezoelectricity before Step 6 is important.

Polarization is produced by a slight shift of the constituent elements of an ionized piezoelectric crystal. The amount of energy required for the slight shift is less than the amount of energy from the deviation of the constituent elements from a crystal unit. Therefore, when ions are implanted in the same direction as the shift direction of ions showing spontaneous polarization, polarization inversion of spontaneous polarization is prevented.

For example, in the case of $LiTaO_3$ or $LiNbO_3$, Li ions and Ta ions or Nb ions slightly shift in the +C axis direction, and thus, ions are preferably implanted from the −C axis direction to the +C axis direction. In addition, when the angle θ of the C axis with respect to the direction of ion implantation is within the range of about −90°<θ< about +90°, the spontaneous polarization is prevented.

In step 4, separation is preferably performed at a temperature less than the Curie temperature of the piezoelectric material. When the separation temperature exceeds the Curie temperature, polarization is released, thereby degrading piezoelectricity.

According to discoveries made by the inventors of the present invention, the heating temperature required for separation at the defective layer in step 4 is about 500° C. to about 600° C. The Curie temperature of a $LiTaO_3$ wafer supplied for electronic components is as low as about 600° C., and the heating temperature required for separation is close to the Curie temperature. Therefore, the piezoelectricity is easily degraded. When the composition ratio x of Li to Ta or Nb in $LiTaO_3$ or $LiNbO_3$ is about 48.0%≤x≤about 49.5%, this is referred to as a "congruent composition" and is used for wafers used as the piezoelectric substrates for the electronic components. On the other hand, when the composition ratio is about 49.5%≤x≤about 50.5%, this is referred to as a "stoichiometric composition". In the case of $LiTaO_3$, the congruent composition has a Curie temperature of about 590° C. to about 650° C., and the stoichiometric composition has a Curie temperature of about 660° C. to about 700° C. Therefore, when $LiTaO_3$ is used, the stoichiometric composition in which the Li composition ratio to Ta is about 49.5%≤x≤about 50.5% is preferable because the deterioration of piezoelectricity during heating in step 4 is prevented In the case of $LiNbO_3$, the congruent composition has a Curie temperature of about 1100° C. to about 1180° C., and the stoichiometric composition has a Curie temperature of about 1180° C. to about 1200° C.

When a piezoelectric material has pyroelectricity, a charge is accumulated on a substrate surface due to heating and cooling in Step 4. When an electric field caused by the charge accumulated on the surface is applied from a direction opposite to the polarization direction beyond the coercive electric field of a piezoelectric material, polarization is inverted, thereby degrading piezoelectricity. Since an electric field is applied from a direction opposite to the polarization direction during any one of heating and cooling in Step 4, piezoelectricity is easily degraded.

The inventors of the present invention discovered that deterioration of piezoelectricity can be prevented by increasing the conductivity of a piezoelectric material and controlling the rate of temperature changes so that the electric field due to pyroelectric charge is preferably less than the coercive electric field of the piezoelectric material.

In a preferred embodiment of the present invention, a wafer treated by increasing the conductivity of $LiTaO_3$ to about $4 \times 10_{10}$ S/cm was preferably used, and the rate of heating and cooling was decreased so that the surface potential was preferably about 200 V or less in step 4, thereby preventing deterioration of piezoelectricity. Known methods for increasing the conductivity of $LiTaO_3$ and $LiNbO_3$ include a method of annealing at a high temperature in a low-oxygen atmosphere as in Japanese Unexamined Patent Application Publication No. 2004-328712 and a method of heating in a metal powder as in Japanese Unexamined Patent Application Publication Nos. 2005-119906 and 2005-179117.

An example of a composite piezoelectric substrate manufactured by the above-described manufacturing method was studied. That is, a $LiTaO_3$ substrate was used as the piezoelectric substrate, and also a $LiTaO_3$ substrate was used as the supporting substrate, and surfaces of the piezoelectric substrate and the supporting substrate were smoothed by CMP. Then, the surfaces of the piezoelectric substrate and the supporting substrate were irradiated with Ar ion beams in a vacuum to clean and activate the surfaces. The surfaces of the substrates were arranged in contact with one another and bonded to achieve strong bonding by direct bonding of the elements of the substrates. Then, the outer shape of the resulting composite piezoelectric substrate was photographed. In the photograph, visible cavities were not observed at the bonding interface. As a result of TEM (transmission electron microscope) observations of the crystal arrangement of the bonding interface, the ordered crystal arrangement was observed.

The composite piezoelectric substrate 30 manufactured by the above-described manufacturing method includes the piezoelectric separation layer 3 on the surface thereof, and thus, the composite piezoelectric substrate 30 can be used for an acoustic wave device. The remaining piezoelectric substrate 2 is reused to manufacture another composite piezoelectric substrate 30.

Next, steps for manufacturing a SAW device are described with reference to sectional views of FIGS. 5A and 5B.

Figure 5A:
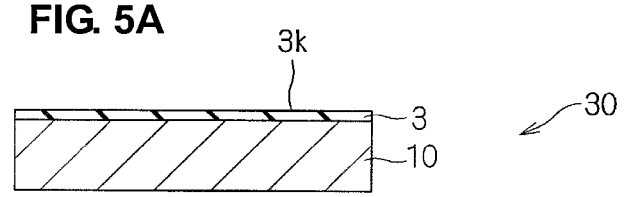
FIGS. 5A and 5B are sectional views showing steps for manufacturing a SAW device according to another preferred embodiment of the present invention.
Figure 5B:
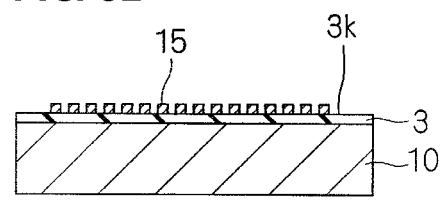
Figure 6:
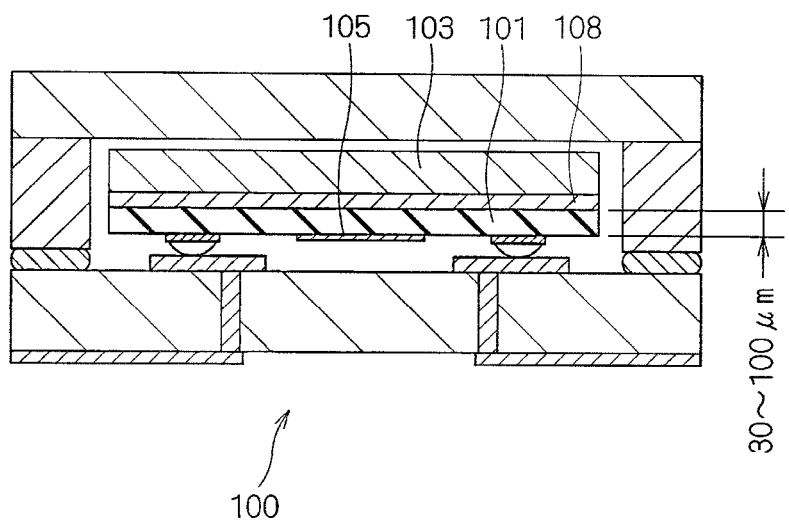
FIG. 6 is a sectional view of a surface acoustic wave device according to the related art.

As shown in FIG. 5A, the composite piezoelectric substrate 30 manufactured by the above-described steps 1 to 6 is prepared, and an IDT electrode 15, for example, is formed on the surface 3k of the composite piezoelectric substrate 30.

For example, an aluminum film was patterned by a photolithography technique on the smoothed surface of the separation layer 3 including a $LiTaO_3$ thin film exposed on the surface 3k of the composite piezoelectric substrate 30 in which the separation layer 3 including a $LiTaO_3$ thin film is bonded to the surface 10a of the supporting substrate 10 to form conductor patterns, such as the IDT electrode 15, a pad electrode (not shown), wiring (not shown) arranged to connect the IDT electrode 15 and the pad electrode. As a result, a SAW device, such as a SAW filter, is manufactured.

The manufacture of a SAW device using the steps described above produces the following effects.

When a SAW device is manufactured, the piezoelectric material and crystal orientation influence the electromechanical coupling coefficient, frequency temperature behavior, and sonic speed, thereby significantly influencing the frequency, band width, insertion loss, and other characteristics of the SAW device. When the piezoelectric material and crystal orientation can be freely selected, an excellent SAW device can be formed.

However, when a piezoelectric thin film is formed by a deposition method, such as sputtering, CVD, or other suitable method, the material of the thin film and the crystal orientation is severely limited. That is, AlN and ZnO can be used as materials for the thin film, and there are few types of films that can be formed by the deposition method. In addition, it is difficult to form a piezoelectric single crystal, and only C-axis oriented films can typically be obtained. Therefore, it is difficult to excite SH-type SAWs because the piezoelectric axis is typically aligned only in the vertical direction.

On the other hand, the method of separating a thin film from a piezoelectric single crystal according to preferred embodiments of the present invention has a high degree of freedom of the piezoelectric crystal orientation, and thus, can produce an excellent 36°-46° Y-cut piezoelectric substrate for exciting SH-type SAWs.

The Si substrate is inexpensive as compared to piezoelectric substrates, such as expensive $LiTaO_3$ and $LiNbO_3$ substrates, and a quartz substrate, for example, which exhibit a low growth rate of a single crystal, which are difficult to slice due to easy fracturing, and which are expensive due to the rare raw materials, such as Li and Ta.

That is, an expensive piezoelectric substrate is typically used for a SAW device wafer. In contrast, in the composite piezoelectric substrate according to preferred embodiments of the present invention, only an inexpensive Si substrate and a piezoelectric thin film are used to manufacture a SAW device wafer. In addition, several tens to several hundreds of thin films can be obtained from a piezoelectric substrate, thereby reducing the amount of the material used to a negligible level. Therefore, the amount of rare expensive Li and Ta that is used is significantly reduced, and an inexpensive piezoelectric substrate having a small environmental load can be formed.

A RF filter for a cellular phone is preferably resistant to the application of electric power of about 1 W to about 2 W. The electric power resistance of a SAW filter is significantly influenced by the temperature of an IDT region when an electric signal is supplied. When the temperature of the IDT region is increased to about 250° C., for example, by application of electric power, the time until fracture of the SAW filter is significantly reduced. The temperature of the IDT region is increased by the phenomenon that Joule heat caused by electric ohmic loss and heat generated by elastic sound absorption are not sufficiently radiated due to the low thermal conductivity of a piezoelectric substrate. A piezoelectric substrate made only of a piezoelectric material, such as $LiTaO_3$ or $LiNbO_3$, for example, has a thermal conductivity less than Si, and thus, has a low heat radiation property. The composite piezoelectric substrate according to preferred embodiments of the present invention has a thermal conductivity that is the same or substantially the same as Si, and thus, has a relatively high heat radiation property. Therefore, the substrate is resistant to the application of large electric power.

The thickness of an ultra-thin piezoelectric material is determined by the energy of ion implantation. Therefore, unlike in polishing, the thickness does not depend on waviness of the substrate, and thus the ultra-thin piezoelectric material with a stable thickness can be formed. The thickness of the piezoelectric thin film is important because it determines the SAW sound speed (the frequency is determined because frequency=sound speed/wavelength). The composite piezoelectric substrate according to preferred embodiments of the present invention enables the formation of a piezoelectric thin film having a uniform thickness, thereby stabilizing the characteristics of the SAW device.

A 42° Y-cut $LiTaO_3$ substrate has a -Z axis that is inclined at about 42° C. on the front surface side. The Li atoms and Ta atoms defining $LiTaO_3$ slightly shift to the back side (+Z axis side) and produce spontaneous polarization. In preferred embodiments of the present invention, polarization inversion is prevented by the ion implantation from the -Z axis side.

The composite piezoelectric substrate manufactured through steps 1 to 6 can be used not only for a SAW filter but also for a filter using a boundary wave, a plate wave such as a Lamb wave, or other suitable filter. In the case of a boundary wave, an element portion may be formed on the composite piezoelectric substrate as shown in FIGS. 2A-2F. When a plate wave is used, as shown in FIGS. 3A-3F described below, the supporting substrate may preferably be etched from the back side to expose the piezoelectric separation layer from the back side.

Since Si has a smaller coefficient of thermal expansion than $LiTaO_3$, the composite piezoelectric substrate having the $LiTaO_3$ separation film bonded to the Si supporting substrate is capable of suppressing the temperature coefficient of resonant frequency.

A bulk acoustic wave (BAW) device according to another preferred embodiment of the present invention is described with reference to FIGS. 2A-2F, which are sectional views showing steps of manufacturing a BAW device.

The BAW device according to this preferred embodiment is preferably manufactured by the following steps.

Figure 2A:
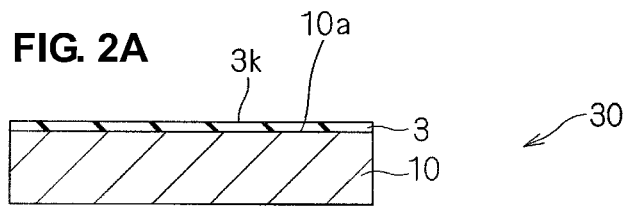
FIGS. 2A-2F are sectional views showing steps for manufacturing a BAW device according to another preferred embodiment of the present invention.
Figure 2B:
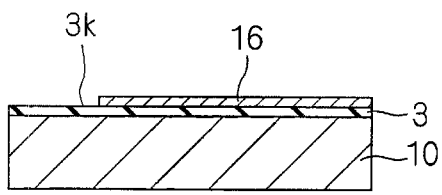

First, as shown in FIG. 2B, a composite piezoelectric substrate 30 is prepared. The composite piezoelectric substrate 30 having the 20° Y-cut $LiTaO_3$ separation layer 3 bonded to the surface 10a of the supporting substrate 10 is formed by substantially the same steps as steps 1 to 5 of the preferred embodiment shown in FIGS. 1A-1 through 1F-2, using a 20° Y-cut $LiTaO_3$ piezoelectric substrate and a Si supporting substrate 10.

Next, as shown in FIG. 2B, an upper electrode 16 is formed on the surface 3k of the composite piezoelectric substrate 30. For example, the upper electrode 16 is preferably formed on the surface 3k of the $LiTaO_3$ separation layer 3 by an electron beam evaporation method and a photolithography method using aluminum.

Figure 2C:
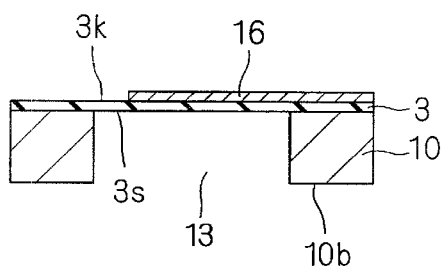

Next, as shown in FIG. 2C, a hole 13 is formed in the supporting substrate 10 to expose the back surface 3s of the separation layer 3. For example, the Si supporting substrate 10 is preferably etched from the back side 10b opposite to the separation layer 3 by photolithography and reactive ion etching to form the hole 13, thereby exposing the back surface 3s of the piezoelectric separation layer 3.

Figure 2D:
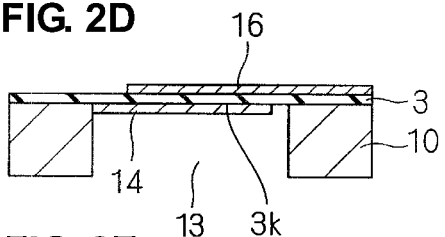

Next, as shown in FIG. 2D, a lower electrode 14 is formed on the back surface 3s of the separation layer 3. For example, the lower electrode 14 is preferably formed on the back surface 3s of the $LiTaO_3$ separation layer 3 by an electron beam evaporation method and a photolithography method using aluminum.

Figure 2E:
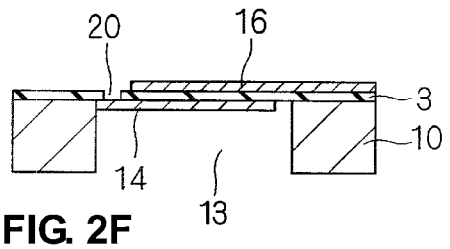

Next, as shown in FIG. 2E, a hole 20 is formed in the separation layer 3 to expose the lower electrode 14. For example, the hole 20 is preferably formed from the surface 3k side of the $LiTaO_3$ separation layer 3 by photolithography and reactive ion etching.

Figure 2F:
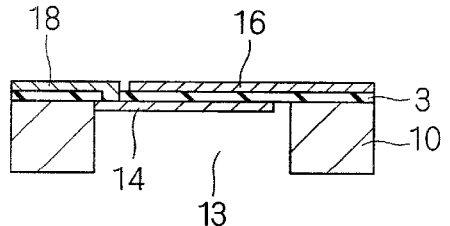

Then, as shown in FIG. 2F, wiring 18 is formed to be electrically connected to the lower electrode 14 through the hole 20. For example, the wiring 18 is preferably formed by photolithography and an evaporation method using aluminum so as to be connected to the lower electrode 14 through the hole 20 of the $LiTaO_3$ separation layer 3. Although not shown in FIG. 2F, in order to decrease the electrical resistance of the wiring 18, aluminum is thickly deposited on a region other than a vibration region of the bulk acoustic wave device, i.e., a region in which the lower electrode 14 and the upper electrode 16 face each other with the separation layer 3 provided therebetween, and the wiring 18 is connected to an external terminal, followed by packaging.

The manufacture of a BAW device by the above-described steps produces the following effects.

When a BAW device is manufactured, the piezoelectric material and the crystal orientation influence the electromechanical coupling coefficient, frequency temperature behavior, and sonic speed, thereby significantly influencing the frequency, band width, insertion loss, and other characteristics of the BAW device. When the piezoelectric material and crystal orientation can be freely selected, an excellent BAW device can be formed. When a piezoelectric thin film is formed by the deposition method such as sputtering, CVD, or other suitable method, the materials of the thin film and crystal orientation are severely limited. That is, AlN and ZnO can be used as materials for the thin film, and there are few types of films which can be formed by the deposition method. In addition, it is difficult to form a piezoelectric single crystal, and only C-axis oriented films can be typically obtained. Therefore, it is difficult to excite thickness-shear BAW because the piezoelectric axis is aligned only in the vertical direction.

On the other hand, the method of separating a thin film from a piezoelectric single crystal according to a preferred embodiment of the present invention has a high degree of freedom of piezoelectric crystal orientation, and thus, can produce an excellent substrate for exciting thickness-shear BAW.

In addition, the energy trapped state and spurious application of the BAW device are determined by a dispersion relation of a bulk wave that is excited. However, a high-Q bulk acoustic wave device satisfying energy trapping and spurious suppression can be formed by controlling the material and the crystal orientation.

Piezoelectric substrates, such as a $LiTaO_3$ substrate, a $LiNbO_3$ substrate, a quartz substrate, and other suitable substrates exhibit a low growth rate of a single crystal and are difficult to slice because they easily fracture and are expensive due to the rare raw materials, such as Li and Ta, for example. A proposed method for forming a composite piezoelectric substrate including a single crystal thin film formed thereon is a method of bonding a Si substrate and a piezoelectric substrate, and then thinning the piezoelectric material by CMP (chemical mechanical polishing). In this case, the Si substrate and the piezoelectric substrate are required to form a composite piezoelectric substrate, and thus, a large amount of an expensive piezoelectric material is wasted.

In the composite piezoelectric substrate according to preferred embodiments of the present invention, only an inexpensive Si substrate and a piezoelectric thin film are used to manufacture a BAW device wafer. In addition, several tens to several hundreds of piezoelectric thin films can be obtained from a piezoelectric substrate, thereby greatly reducing the amount of the material used to a negligible level. Therefore, the amount of rare expensive Li and Ta used can be greatly reduced, and an inexpensive piezoelectric substrate having a small environmental load can be formed.

The thickness of an ultra-thin piezoelectric material is determined by the energy of ion implantation. Therefore, unlike polishing, the thickness does not depend on the waviness of the substrate, and thus, the ultra-thin piezoelectric material having a stable thickness can be formed. The thickness of the piezoelectric thin film is important because it determines the BAW wavelength. That is, the frequency is determined because frequency=sound speed/wavelength.

A BAW device according to another preferred embodiment of the present invention is described with reference to FIGS. 3A-3F and 4. FIGS. 3A-3f are sectional views showing the steps for manufacturing a BAW device, and FIG. 4 is a plan view of a BAW device.

The BAW device of this preferred embodiment is preferably manufactured through the following steps.

First, a composite piezoelectric substrate is prepared by the same steps as steps 1 to 5 described above with reference to FIG. 1A-1 through FIG. 1F-2.

Figure 3A:
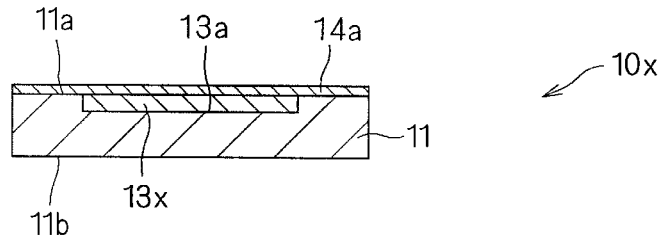
FIGS. 3A-3F are sectional views showing steps for manufacturing a BAW device according to another preferred embodiment of the present invention.
Figure 3B:
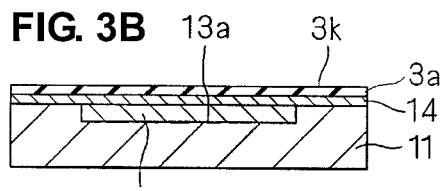
Figure 4:
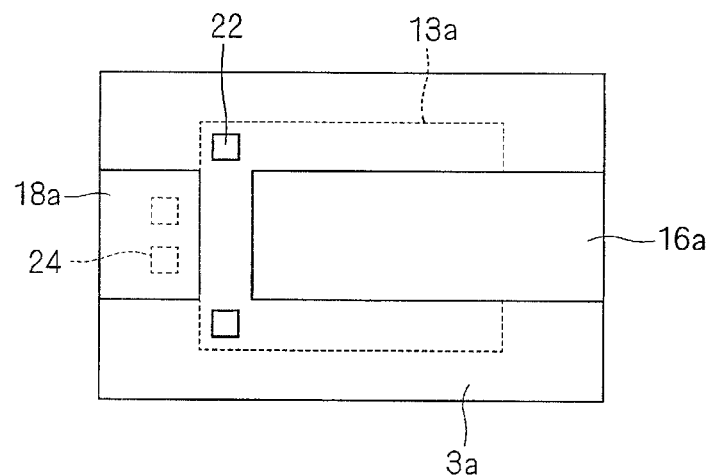
FIG. 4 is a sectional view of a BAW device according to another preferred embodiment of the present invention.

In step 1, a 20° Y-cut $LiTaO_3$ piezoelectric substrate and a supporting substrate 10x shown in FIG. 3A are prepared. The supporting substrate 10x is prepared by forming a recess 13a in a Si supporting substrate 11 preferably by reactive ion etching, for example, forming a sacrifice layer 13x in the recess 13a, smoothing a surface 11a of the Si supporting substrate 11 by CMP, and forming a lower electrode 14a by sputtering using tungsten (W). In step 2, ions are implanted into the piezoelectric substrate. In step 3, the piezoelectric substrate is metallically bonded to the lower electrode 14a of the supporting substrate 10x to form a bonded substrate body. In step 4, the bonded substrate body is separated at a defective layer of the piezoelectric substrate. In step 5, the surfaces of the piezoelectric substrate and the supporting substrate are smoothed to provide a composite piezoelectric substrate 30a having the 20° Y-cut $LiTaO_3$ separation layer 3a as shown in FIG. 3B.

Figure 3C:
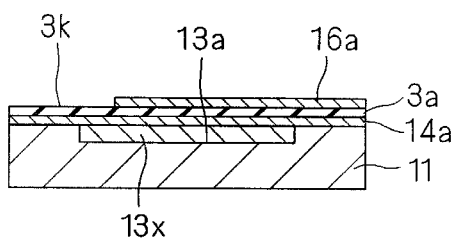

Next, as shown in FIG. 3C, an upper electrode 16a is formed on the surface 3k of the $LiTaO_3$ separation layer 3a preferably by an electron beam evaporation method and a photolithography method using aluminum, for example.

Figure 3D:
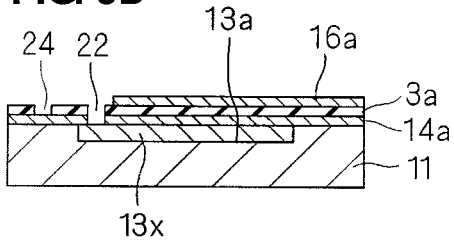

Next, as shown in FIG. 3D, a hole 22 extending to the sacrifice layer 13x and a hole 24 extending to a lower electrode 14a are formed in the separation layer 3a and the lower electrode 14a by photolithography and reactive ion etching.

Figure 3E:
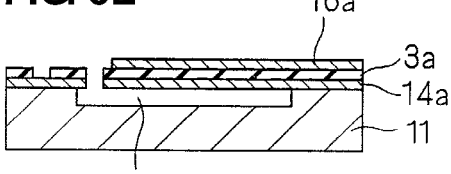

Next, as shown in FIG. 3E, the sacrifice layer 13x is removed by dry etching through the hole 22 reaching the sacrifice layer 13x.

Figure 3F:
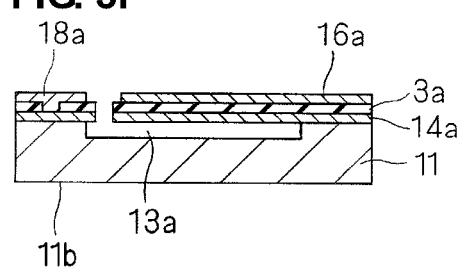

Then, as shown in FIG. 3F and FIG. 4, wiring 18a is formed by photolithography, for example, and an evaporation method using aluminum to be connected to the lower electrode 14a through the hole 24 extending to the lower electrode 14a. Although not shown in the drawing, in order to decrease the electric resistance of the wiring 18a, aluminum is thickly deposited on a region other than a vibration region of the bulk acoustic wave device, i.e., a region in which the lower electrode 14a and the upper electrode 16a face each other with the separation layer 3a provided therebetween, and the wiring 18a is connected to an external terminal, followed by packaging.

When the hole 13 is formed in the back surface 10b of the supporting substrate 10, it is necessary to cover the back surface 10b side by laminating another substrate. However, in the structure of the present preferred embodiment, a hole is not formed in the supporting substrate 11, and thus, closing of the back surface side is not required. The other effects are substantially the same as in the preferred embodiments described above.

When a composite piezoelectric substrate is manufactured by the above-described method, an ultra-thin piezoelectric film can be formed by efficiently using a piezoelectric material.

The present invention is not limited to the above-described preferred embodiments, and various modifications can be made in accordance with the present invention.

For example, the composite piezoelectric substrate manufactured by the method according to preferred embodiments of the present invention can be used for a SAW device, a BAW device, a sensor element, a flexural vibrator, and other various devices, for example.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a composite piezoelectric substrate comprising:
   a first step of preparing a piezoelectric substrate and a supporting substrate;
   a second step of implanting ions from a surface of the piezoelectric substrate to form a defective layer in a region at a predetermined depth from the surface of the piezoelectric substrate;
   a third step of bonding the supporting substrate to the surface of the piezoelectric substrate to form a substrate bonded body;
   a fourth step of separating the substrate bonded body at the defective layer formed in the piezoelectric substrate so that a separation layer between the surface of the piezoelectric substrate and the defective layer is separated from the piezoelectric substrate and bonded to the supporting substrate to form the composite piezoelectric substrate;
   a fifth step of smoothing the surface of the separation layer of the composite piezoelectric substrate; and
   a polarization step of polarizing the separation layer of the composite piezoelectric substrate after the second step and before the third step, or after the third step to correct polarization inversion of piezoelectric material in the separation layer.

2. The method for manufacturing a composite piezoelectric substrate according to claim 1, wherein the polarization step is a step in which an electric field is intermittently applied to the separation layer.

3. The method for manufacturing a composite piezoelectric substrate according to claim 1, wherein the polarization step is performed at a heating temperature of at least about 100° C. less than the Curie temperature of the piezoelectric substrate.

4. The method for manufacturing a composite piezoelectric substrate according to claim 1, the polarization step is performed at a heating temperature of about 200° C. or more.

5. The method for manufacturing a composite piezoelectric substrate according to claim 1, further comprising:
   a step of depositing a small amount of metal elements at a bonding interface between the supporting substrate and the surface of the piezoelectric substrate.

6. The method for manufacturing a composite piezoelectric substrate according to claim 1, wherein
   a lithium-based piezoelectric material is used for the piezoelectric substrate.